(12) United States Patent
Boernert et al.

(10) Patent No.: US 8,736,265 B2
(45) Date of Patent: May 27, 2014

(54) B1-MAPPING AND B1L-SHIMMING FOR MRI (75) Inventors: Peter Boernert, Hamburg (DE); Peter Koken, Hamburg (DE); Kay Nehrke, Ammersbek (DE); Ulrich Katscher, Norderstedt (DE); Ingmar Graesslin, Boenningstedt (DE)

(73) Assignee: Koninklijke Philips N.V., Eindhoven (NL)

( * ) Notice: Subject to any disclaimer, the term of this patent is extended or adjusted under 35 U.S.C. 154(b) by 331 days.

(21) Appl. No.: 13/063,472

(22) PCT Filed: Sep. 10, 2009

(86) PCT No.: PCT/IB2009/053956
§ 371 (c)(1),
(2), (4) Date: Mar. 11, 2011

(87) PCT Pub. No.: WO2010/032172
PCT Pub. Date: Mar. 25, 2010

(65) Prior Publication Data
US 2011/0156704 A1 Jun. 30, 2011

(30) Foreign Application Priority Data

Sep. 17, 2008 (EP) .................................... 08164503
Sep. 19, 2008 (EP) .................................... 08164673

(51) Int. Cl.
*G01R 33/34* (2006.01)
(52) U.S. Cl.
USPC .......................................... 324/309; 324/307
(58) Field of Classification Search
USPC ............ 324/300–322; 382/131; 600/410–420
See application file for complete search history.

(56) References Cited

U.S. PATENT DOCUMENTS

| | | | |
|---|---|---|---|
| 5,617,028 A | 4/1997 | Meyer et al. | |
| 6,529,002 B1 | 3/2003 | Kim et al. | |
| 6,989,673 B2 | 1/2006 | Zhu | |
| 7,218,113 B2 | 5/2007 | Feiweier et al. | |
| 7,336,145 B1 | 2/2008 | Zelinski et al. | |
| 7,385,396 B2 | 6/2008 | Zhu | |
| 2003/0098687 A1* | 5/2003 | Arneth et al. | 324/309 |
| 2005/0189940 A1 | 9/2005 | Feiweier et al. | |
| 2007/0010897 A1 | 1/2007 | Stone | |

(Continued)

FOREIGN PATENT DOCUMENTS

| | | |
|---|---|---|
| WO | 2005091011 A1 | 9/2005 |
| WO | 2007042951 A1 | 4/2007 |
| WO | 2008026174 A2 | 3/2008 |

OTHER PUBLICATIONS

Katscher et al. "Parallel RF transmission in MRI." May 2006, NMR in Biomedicine, vol. 19, Issue 3, pp. 393-400.*

(Continued)

*Primary Examiner* — Melissa Koval
*Assistant Examiner* — Rishi Patel (57) ABSTRACT

The invention relates to a method of acquiring MRI image data comprising the following steps: performing a 3-dimensional B1 mapping of a first volume using a first voxel size, selecting an MRI protocol, performing the B1-shim in accordance with the MRI protocol, performing the MRI protocol to acquire MRI imaging data of a second volume using a second voxel size, wherein the first voxel size is larger than the second voxel size, wherein the first volume is larger than the second volume, and wherein the second volume is contained within the first volume.

17 Claims, 7 Drawing Sheets

(56) References Cited

U.S. PATENT DOCUMENTS

| | | | |
|---|---|---|---|
| 2007/0164744 A1 | 7/2007 | Kuhara | |
| 2008/0088305 A1* | 4/2008 | Olson et al. | 324/309 |
| 2008/0129298 A1 | 6/2008 | Vaughan et al. | |

OTHER PUBLICATIONS

Gregory J. Metzger et al, "Local B1+Shimming for Prostate Imaging With Transceiver Arrays at 7T Based on Subject-Dependent Transmit Phase Measurements", Magnetic Resonance in Medicine, vol. 59, Jan. 28, 2008, pp. 396-409.

Kyunghyun Sung et al, "B1+Compensation in 3T Cardiac Imaging Using Short 2DRF Pulses", Magnetic Resonance in Medicine, vol. 59, Jan. 24, pp. 441-446.

M. Schar et al, "Simultaneous B0 and B1-Map Acquisition for Fast Localized Shim, Frequency and RF Power Determination in the Heart at 3T", Proc. Intl. Soc. Mag. Reson. Med., May 16, 2008, p. 358.

T.W. Scheenen et al, "High Spatial Resolution Short TE Proton-Echo-Planar-Spectroscopic-Imaging (PEPSI) in Human Brain at 7 Telsa Using B1-Compensation and Adiabatic Refocusing", Proc. Intl. Soc. Mag. Reson. Med. May 16, 2008, p. 1593.

J.V. Hajnal et al, "Initial Experience With RF Shimming at 3T Suing a Whole Body 8 Channel RF System", Proc. Intl. Soc. Mag. Reson. Med. May 16, 2008, p. 496.

T. Wade et al, "Comparison of Current B1 Mapping Techniques", Proc. Intl. Soc. Mag. Reson. Med., 15, 2007, p. 354.

U. Katscher et al, "RF Shimming Using a Multi-Element Transmit System in Phantom and in Vivo Studies", Proc. Intl. Soc. Mag. Reson. Med. 15, 2007, p. 1693.

Dan Xu et al, "A Noniterative Method to Design Large-Tip-Angle Multidimensional Spatially-Selective Radio Frequency Pulses for Parallel Transmission", Magnetic Resonance in Medicine, vol. 58, No. 2, Aug. 1, 2007, pp. 326-334.

Z. Wang et al, "RF Shimming Considering Both Excitation Homogeneity and SAR", Proc. Intl. Soc. Mag. Reson. Med. 15, Jan. 1, 2007, p. 1022.

Kawin Setsompop et al, "Parallel RF Transmission With Eight Channels at 3 Tesla", Magnetic Resonance in Medicine, vol. 56, No. 5, Nov. 2, 2006, pp. 1163-1171.

Y. Zhu et al, "Parallel Excitation on an Eight Transmit-Channel MRI System", Proc. Intl. Soc. Mag. Reson. Med. 13, 2005, p. 14.

Yudong Zhu, "Parallel Excitation With an Array of Transmit Coils", Magnetic Resonance in Medicine, vol. 51, Jan. 1, 2004, pp. 775-784.

Weihua Mao et al, "Exploring the Limits of RF Shimming for High-Field MRI of the Human Head", Center for NMR Research, Department of Radiology, Wiley Interscience: Journal: Abstract, 2 Pages.

Dowell, Nicholas G. et al, Fast, Accurate, and Precise Mapping of the RF Field in Vivo using the 180 Signal Null, Magnetic Resonance in Medicine, vol. 58, pp. 622-630, 2007.

Griswold, Mark A. et al "Generalized Autocalibrating Partially Parallel Acquisitions (GRAPPA)", Magnetic Resonance in Medicine vol. 47, 2002, pp. 1202-1210.

Katscher, Ulrich et al "Transmit SENSE", Magnetic Resonance in Medicine, vol. 49, 2003, pp. 144-150.

Pressmann, Klaas P. et al "SENSE: Sensitivity Encoding for Fast MRI", Magnetic Resonance in Medicine, vol. 42, 1999, pp. 952-962.

Yarnykh, Vasily L. "Actual Flip-Angle Imaging in the Pulsed Steady State: A Method for Rapid Three-Dimensional Mapping of the Transmitted Radiofrequency Field", Magnetic Resonance in Medicine, vol. 57, 2007, pp. 192-200.

Ibrahim, Tamer S. et al "Application of Finite Difference Time Domain Method for the Design of Birdcage RF Head Coils using Multi-port Excitations", Magnetic Resonance Imaging, vol. 18, 2000, pp. 733-742.

Cunningham, Charles H. et al "Saturated Double-Angle Method for Rapid B1+ Mapping", Magnetic Resonance in Medicine, vol. 55, 2006, pp. 1326-1333.

Van Der Meulen, P. et al "A Novel Method for Rapid Pulse Angle Optimisation" SMRM, 1086, pp. 1129-1130.

Reeder, Scott B. et al "Iterative Decomposition of Water and Fat with Echo Asymmetry and Least-Squares Estimation (IDEAL): Application with Fast Spin-Echo Imaging", Magnetic Resonance in Medicine, vol. 54, 205, pp. 636-644.

\* cited by examiner

B1-MAPPING AND B1L-SHIMMING FOR MRI

TECHNICAL FIELD

The invention relates to a method, an apparatus, and a computer program product for performing an integrated B1-shimming of a Magnetic Resonance Imaging (MRI) system.

BACKGROUND AND RELATED ART

A static magnetic field is used by MRI scanners to align the nuclear spins of atoms as part of the procedure for producing images within the body of a patient. This static magnetic field is referred to as the B0 field. It is commonly known that increasing the strength of the B0 field used for performing an MRI scan offers the opportunity of increasing the spatial resolution and contrast resolution of the diagnostics images. This increase in resolution and contrast benefits physicians using an MRI image to diagnose a patient.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used.

However, a technical challenge in increasing the magnetic field strength used for clinical MRI is imposed by the dielectric properties of the body. The perturbations caused by the transceiver coil are used for manipulating the orientation of nuclear spins aligned with the B0 field. The problem is that dielectric properties of the body cause the wavelength $\lambda$ of the transmitted RF field (so-called B1 field) to become shorter, $\lambda \sim 1/B0$. As the B0 field increases, the wavelength of the RF field necessary to manipulate the nuclear spin decreases. Outside of the body, the wavelength of the RF field can be on the order of meters. Within the body it is much shorter. If the B0 field is strong enough, then the wavelength of the RF pulse within the body will have decreased to the point where there are RF standing waves within the body. This causes the local perturbations to the magnetic field induced by the transmitter coil to become non-uniform, resulting in non-uniform excitation, signal strength, and contrast in standard MRI sequences. This is known as B1 inhomogeneity. This can lead to errors in contrast of diagnostic images and to the possibility of a misdiagnosis.

To counteract this effect, phased array transceiver coils are used. These coils comprise multiple elements wherein the amplitude and phase of the RF radiation generated by an individual element is controlled relative to other elements of the antenna. The process of choosing the proper phases and amplitudes to counteract the B1 inhomogeneity effects is known as B1-shimming. To perform a B1-shim, a map of the transmit field is constructed. This process is known as B1 mapping. B1 shimming is described in Yudong Zhu, U.S. Pat. No. 6,989,673 (Cited as Zhu). Zhu discloses a system composed of multiple transmit coils with corresponding RF pulse synthesizers and amplifiers.

Current methods of B1-shimming concentrate on homogenizing the B1 field. On average, the resulting shimmed B1 field is lower than the average unshimmed field. In order to have a B1 field that is strong enough to tip the nuclear spins to the desired flip angle, the transmit power has to be increased. This leads to higher Specific Absorption Rate (SAR) values. To solve this problem, it has been suggested to calculate or estimate the electric fields produced by the transmit elements and use this information to minimize the resulting total electric field. This is impractical in a clinical setting, because the calculation of the electric fields requires extensive off-line modeling and calculations.

Currently, B1 mapping and shimming is only done for individual volumes or individual slices being imaged during an MRI examination. A slice is a common term in the art used to refer to a thin volume that is imaged. The term volume is understood to refer to slices also. The B1-shimming of the individual volumes being imaged is not sufficient. For example, in a modern MRI experiment a variety of RF pulses are employed during the scan preparation phase to optimize the scan conditions such as the determination of the resonance frequency f0 or the B0-shim, each performed in separate volumes. These RF pulses are also used for magnetization preparation such as the REST, SPIR, and Inversion techniques. Such preparation MRI pulse sequences are used to manipulate the desired image contrast and image quality or to encode additional information. Further examples would be the navigator RF pulse technique that is used for motion sensing or similar RF pulses used for local Arterial Spin Labeling (ASL). Optimal image quality requires the optimal performance of these techniques.

These techniques are seriously compromised by the B1 inhomogeneities present at high B0 fields. This makes local B1 shimming mandatory. The individual pulse sequences operate on different parts of the body, and have a different local scope. Many techniques rely also on having a uniform B1 field outside of the slice or volume being imaged. For example, REgional Saturation Technique (REST) or an ASL preparation pulses are often applied outside the imaging volume of interest. For these pulse sequences, information about the B1 field is missing using standard techniques.

The static magnetic field, B0, is typically manipulated using gradient coils. The process of adjusting the B0 field using these gradient coils is referred to as B0 shimming.

SUMMARY OF THE INVENTION

The invention provides for a method of acquiring MRI image data, a computer program product, and an apparatus for acquiring MRI image data as claimed in the independent claims. Embodiments of the invention are given in the dependent claims.

In accordance with embodiments of the invention a volumetric B1 mapping procedure is performed, preferable as a pre-scan, performed at the beginning of a patient's examination. This is similar to the reference scan concept in the framework of parallel imaging, where the spatial sensitivity distributions of the individual RF antennas are acquired prior to the diagnostic scan. The reference scan concept is described in Pruessmann K P, et al. Magn Reson Med. 1999; 42:952-62 (cited as Pruessmann). Three-Dimensional (3D) B1 mapping has to cover an appropriate region (volume) to allow subsequent B1 shimming for all RF objects involved in the subsequent scanning procedures. Scanning procedures are referred to as MRI protocols. An RF object is a component of the MRI pulse sequence which describes the RF pulse. An RF object is comprising the elements which define the characteristics of the RF pulse, examples of these elements are: the RF waveform, the transmit frequency, the transmit gain settings on the elements of the phased array transmitter coil, and the phase relationship between the elements of the phased array transceiver coil. One prerequisite to do this is to use a time efficient 3D mapping sequence. Different approaches for implementing a 3D mapping sequence are discussed in the literature: Yarnykh V L. Magn Reson Med. 2007 January; 57(1):192-200 (cited as Yarnykh), van der Meulen P, van Yperen G H. Proc. SMRM; 1986; p. 1129 (cited as van der Meulen), Cunningham C H, Pauly J M, Nayak K S. Magn. Reson. Med 2006; 55:1326-1333 (cited as Cunningham), and Dowell N G, Tofts P S. Magn. Reson. Med. 2007; 58:622-30 (cited as Dowell). These techniques can be expanded into three dimensions. To accelerate these techniques, i.e., to map the enlarged volume without an increase in measurement time, fast imaging techniques like Echo Pulse Imaging (EPI) or other efficient sampling schemes can be used.

Parallel imaging can be used to further accelerate data acquisition. A SENSE scan would need the knowledge about the receive coil sensitivities prior to data acquisition whereas a GRAPPA scan does not. The GRAPPA scan is described in Griswold M A, et al. Magn. Reson. Med. 2002; 47:1202-1210 (cited as Griswold). In that respect GRAPPA could be of advantage because it allows performing this B1 transmit mapping before the SENSE reference scan. An important point of consideration is the mandatory spatial resolution or voxel size necessary to capture the most essential feature of the individual coil sensitivities. The voxel size is proportional to the total measuring time for volume coverage.

Furthermore, an efficient volume B1 mapping can be merged with an appropriate B0 mapping. B0 field maps can be acquired by means of multi-echo sequences sampling the same k-space sample at different echo times. To cope with the potential water and fat problem a 3-point approach is proposed similar to the technique described by Reeder in Reeder S B, et al. Magn. Reson. Med. 2005; 54:636-44.

Based on the pre-scan data, B1 maps can be extracted which form the basis to calculate optimal B1 shimming parameters for all RF objects with respect to their location. Thus, for each individual RF object a separate linear or non-linear optimization is performed to find the appropriate phase- and amplitude-sets $(A_n, \phi_n)$ for the individual transmit coil elements and their sensitivity $(B1_n(r))$ according to $$B1_{super}(r) = \Sigma A_n \exp(i\phi_n) B1_n(r) \quad (1)$$

resulting in a uniform superimposed transmit field ($B1_{super}$). It is important to note that the optimization given in Eq. (1) should be restricted only to the volume of the corresponding RF. The main goal is the homogenization of the B1 field. However, for certain MRI protocols a spatially dependent B1 profile may be desired. This can also be realized by using a superposition according to Eq. (1), by changing the necessary $(A_n, \phi_n)$ tuples. Optimal transmit settings can be obtained for all RF objects that will be used in the entire examination based on the B1 map obtained by this volumetric mapping process.

The Specific Absorption Rate (SAR) is defined herein as the RF power absorbed per unit of mass. The local SAR is defined herein as the value of the SAR of the voxel with the largest SAR. The global SAR is defined herein as the SAR integrated over the whole object being imaged.

A cost function is defined herein as a function whose dependent variable is maximized or minimized by an optimization algorithm. The optimization algorithm adjusts the independent variable or variables to perform the optimization.

A regularization parameter is defined herein as being a parameter used in a cost function that is used to control the relative influence of two or more terms on the result of the optimization.

A transmit channel is defined herein as being the individual RF circuit that corresponds to each element of a multi-element transmitter coil or a multi-element transceiver coil. The term transmit channels is defined herein as being the collection of all of the transmit channels.

A complex amplitude is defined herein as being the phase and amplitude of the current applied to an individual transmit channel. This is called a complex amplitude, because a complex amplitude can be specified using a phase and an amplitude or it can be expressed in the form of a complex number. The complex amplitudes are defined herein as the set of all of the complex amplitudes which correspond to the transmit channels. Adjusting the complex amplitudes to make the B1 field more homogeneous is B1-shimming.

The spatial transmit sensitivity is defined herein as being the spatially dependent B1 field produced by a transmit channel.

The forward RF power is defined herein as total power transmitted by the RF transmitter, disregarding the portion of the RF power which is reflected back into the RF transmitter.

The Field Of View (FOV) is defined herein as meaning the volume for which an MRI image is constructed. The MRI data used to construct an MRI image is radio signals that are collected in the frequency domain. It is therefore important to note that the MRI data is converted into an image using a Fourier integral, and as a result tissues outside of the FOV contribute to the image.

Embodiments of the invention provide for a fast and efficient way to minimize the increase in SAR caused by B1-shimming. Standard RF B1-shimming is typically performed by minimizing a cost function. These functions typically comprise the standard deviation of the resulting B1 map, and are solved using a non-linear, iterative search.

Embodiments of the invention modify this cost function using a SAR-related term that is weighted with a regularization parameter. This regularization parameter controls the trade-off between RF power and B1 field homogeneity. The SAR-related term is proportional to the sum of squared amplitudes of the shim weights, and it yields the forward RF power, which can be used as a measure of the SAR in a patient.

This is described mathematically for a multi-transmit system with N transmit channels and $T_n(x)$ the corresponding (complex) spatial transmit sensitivity distributions (n=1 ... N). The sum of all of these sensitivities is the total transmit sensitivity $\underline{T}_{tot}$ using the set of complex amplitudes $\underline{A}_n = A_n \exp(i\phi_n)$ $$\underline{T}_{tot}(x) = \sum_{n \leq N} \underline{A}_n \underline{T}_n(x). \quad (2)$$

The optimal $A_n$ are determined by minimizing the cost function $\overline{\delta}_{usu}$.

$$\delta_{usu} = \left\langle (T_{tot}(x) - \left\langle T_{tot}(x) \right\rangle)^2 \right\rangle, \quad (3)$$

corresponding to the standard deviation or the normalized root-mean-square error (NRMSE) of the amplitude $T_{tot} = |\underline{T}_{tot}|$ over a predefined ROI. There are no requirements on the phase of $\underline{T}_{tot}$ necessary to enhance the shimming potential using this approach. Therefore, the minimization of Eq. (3) is a non-linear problem, and iterative optimization algorithms are applied.

To estimate the SAR, an RF forward power related term (and thus, an SAR-related term) is added to the cost function of Eq. (3). This new term is weighted with the regularization parameter $\lambda$:

$$\delta_{pro} = \langle (T_{tot}(x) - \langle T_{tot}(x)\rangle)^2\rangle + \frac{\lambda}{\langle T_{tot}(x)\rangle^2}\sum_{n\leq N} A_n^2. \quad (4)$$

$\lambda$ controls the trade-off between RF power and B1 field homogeneity. The scaling of the amplitudes $A_n$ by $\langle T_{tot}(x)\rangle$ is necessary, since $\langle T_{tot}(x)\rangle$ is proportional to the overall scaling of the $A_n$. The forward RF power per transmit channel is proportional to the square of $A_n$.

For small $\lambda$, $\delta_{pro}$ is similar to the standard cost function $\delta_{usu}$. In other words when $\lambda$ is small $T_{tot}$ is made as homogeneous as possible. With increasing $\lambda$, the algorithm provides solutions for $T_{tot}$ that use a small $A_n$. For very large values of $\lambda$, the B1 field is maximized while minimizing $A_n$, and the homogeneity of the B1 field is disregarded. For a birdcage-type coil, this case corresponds to the quadrature mode. Using Eq. (4), $\lambda$ can be varied between 0 and infinity, depending on if and how $T_{tot}$ and $A_n$ are scaled. Eq. (4) can be rewritten in the form:

$$\delta_{pro} = (1-\lambda)\langle(T_{tot}(x) - \langle T_{tot}(x)\rangle)^2\rangle + \frac{\lambda}{\langle T_{tot}(x)\rangle^2}\sum_{n\leq N} A_n^2, \quad (5)$$

where the range of $\lambda$ is limited between 0 and 1. This is a more convenient form for numerical calculations. However, it requires that $T_{tot}$ and $A_n$ are scaled suitably. If the scaling is not chosen properly, the optimum value of $\lambda$ might have a value that complicates numerical calculations such as $\lambda=0.99999999$. Such a value of $\lambda$ can lead to rounding or subtraction errors when used in numerical calculations. The scaling can be chosen arbitrarily, but the scaling factors should be chosen to make the calculations numerical convenient.

Iterative optimization algorithms that are used to solve the cost function of Eq. (3) can be used for solving Eq. (4). Therefore, embodiments of the invention can be implemented by modifying the cost function of Eq. (3). This means that no complicated models or numerically intensive calculations are required to regulate the SAR. The regularization parameter can be adjusted freely by the user, depending on the application and the given SAR constraints.

In embodiments of the invention, a B1-shim is performed for a volume that is greater than or larger than the FOV, and which includes the volume of the FOV. Thus, for each RF object, regardless if it will act inside or outside the desired FOV, an individual B1 shimming is performed, based on the 3D B1 maps. This has the advantage of allowing more complete and flexible B1-shimming during MRI protocols. For many MRI protocols, B1-shimming for RF objects acting outside the FOV is beneficial to the image quality. In addition, this also has the advantage of having a more efficient workflow and of saving time. The larger voxel size of the B1 mapping permits B1-shimming over the entire volume sensitive to the MRI scan. This B1-map can then be used for B1-shimming during a variety of MRI protocols.

In another embodiment, the B1 mapping is performed with an modified Actual Flip-angle Imaging (AFI) pulse sequence, where the timing gradient sequence has had the gradient pulses replaced with Echo Pulse Imaging (EPI) gradient pulses. This has the advantage that the AFI pulse sequence is significantly accelerated.

In another embodiment, a single B1-mapping is performed as part of an MRI pre-scan sequence. This has the advantage of saving time and making for a more efficient workflow. The operator can also perform a variety of MRI protocols incorporating B1-shimming into the entire sensitive area scanned during the MRI pre-scan sequence.

In another embodiment, the B1 mapping is integrated with a B0 mapping. This has the advantage of decreasing the examination time and increasing the workflow.

In another embodiment, the B1 mapping is used during scan preparation pulse sequences or magnetization pulse sequences during the MRI protocol outside of the FOV, but inside the volume of the B1 mapping. This has the advantage of being able to adapt the B1-shimming to a variety of volumes outside FOV. This is important, because volumes outside of the FOV can affect the image quality inside of the FOV.

In another embodiment, the B1 mapping is used for the B1-shimming of MRI techniques selected from the group consisting of: magnetization preparation pulses, fat suppression pulses, motion sensing, arterial spin labeling (ASL), Regional Saturation Technique (REST), Spectral Presaturation Inversion Recovery (SPIR), and Inversion. This is an advantage, because these techniques incorporate volumes outside of the FOV. The large B1 map allows every region which affects image quality to have its own B1-shim parameters optimized.

In another embodiment, the B1 mapping is used for calculating the minimum of a first cost function using an iterative process, wherein the solution to minimizing the first cost function provides a set of complex amplitudes, wherein there is an element of the set of complex amplitudes for each transmit channel, wherein the element specifies the amplitude and phase to be used by its corresponding transmit channel, wherein the first cost function is comprising an SAR term and a second cost function, wherein the second cost function is calculated using the spatial transmit sensitivity distributions for all of the transmit channels and the set of complex amplitudes, wherein the SAR term is calculated using the set of complex amplitudes, the averaged total transmit sensitivity, and a regularization parameter operable for adjusting the trade-off between SAR and B1 field homogeneity, wherein the SAR term is weighted with the regularization parameter, and wherein the SAR term is inversely proportional to the averaged total transmit sensitivity. This has the advantage that the regularization parameter can be used to control a trade-off between the B1 homogeneity and the total forward RF power. This is a benefit, because adjusting the forward RF power is equivalent to adjusting the SAR.

In another aspect the invention relates to a computer program product comprising a set of computer executable instructions can be used for performing embodiments of the method of the invention. Implementing the invention using a computer program product has the advantage that the pulse sequences take place on a time scale which would be too fast for a human operator to control. Automating the method would save time and increase workflow.

In another aspect the invention relates to an MRI apparatus including an MRI system which is comprising: a static magnetic field capable of polarizing nuclear spins within a patient or other object, one or more magnetic field gradient coils, a system of gradient coil power supplies, a location within the magnetic field for the patient, a phased array transceiver coil, and a RF transceiver capable of driving the independent elements of the phased array transceiver coils. A microprocessor or computer system would be used for controlling the MRI system and for using the acquired MRI data to construct MRI images. A computer system can be used for implementing embodiments of the invention. The computer system has a computer program product which is capable of controlling the acquisition of MRI data, interacting with an operator, and for constructing MRI images. This apparatus would have the advantage of allowing more complete and flexible B1-shimming during MRI protocols. These advantages were described previously.

In another embodiment, the apparatus has one or more transmit channels and a means for minimizing a first cost function. The means for minimizing the first cost function can be implemented as a computer or microcontroller. The solution from minimizing the first cost function provides a set of complex amplitudes which specify the phase and amplitude to be used to by the one or more transmit channels. This has the advantage that the set of complex amplitudes specifies the phase for the B1-shimming.

Each element of the set of complex amplitudes specifies the amplitude and phase to be used by its corresponding transmit channel. The first cost function comprises an SAR term and a second cost function. The second cost function is calculated using the spatial transmit sensitivity distributions for all of the transmit channels and the set of complex amplitudes. The SAR term is calculated using the set of complex amplitudes, the averaged total transmit sensitivity, and a regularization parameter operable for adjusting the trade-off between SAR and B1 field homogeneity. The SAR term is weighted with the regularization parameter, and the SAR term is inversely proportional to the averaged total transmit sensitivity. This has the advantage that the regularization parameter can be used to control a trade-off between the B1 homogeneity and the total forward RF power. This is a benefit, because adjusting the forward RF power is equivalent to adjusting the SAR.

In another embodiment, the invention is further comprising a user interface which is adapted to allow an operator to adjust the trade-off between the B1 homogeneity and the total forward RF power by changing the value of the regularization parameter. This is clearly an advantage, because adjusting the forward RF power is equivalent to adjusting the SAR. By adjusting the trade-off between the B1 homogeneity and the forward RF power, an operator is effectively adjusting the trade-off between B1 homogeneity and the SAR.

There are a variety of ways that such a user interface could be implemented. Several examples are: One way would be that the first cost function can be solved for a preselected set of different values of the regularization parameter and the homogeneity and the RF power are displayed to the user. The user is then able to choose which value of the regularization parameter to use. This is advantageous, because the operator is able to see the effect that different values of the regularization parameter has on the B1 homogeneity and the SAR and choose a compromise between the two. Another way of implementing the user interface is that the user interface can comprise a slider which is operable to allow the adjustment of the regularization parameter. The user interface displays the B1 homogeneity and SAR (or RF power) graphically in real time as the slider is adjusted by the operator. This is advantageous because the operator is able to see the effect that changing the regularization parameter has on the B1 homogeneity and the SAR graphically. Both of these user interfaces have the advantage that the trade-off between B1 homogeneity and SAR (or RF power) is displayed graphically and allows the user to select his or her choice.

In another embodiment, the values of the complex amplitudes are calculated using a series of iterative steps, wherein during an iterative step of the series of iterative steps the value of the complex amplitudes is determined for different values of the regularization parameter, and wherein the value of the cost function is calculated for one or more values of the regularization parameter. This has the advantage that the complex amplitudes are determined for different values of the regularization parameter simultaneously.

In another embodiment, a single B1-mapping for a large volume is performed as part of an MRI pre-scan sequence. This has the advantage of saving time and making for a more efficient workflow. The operator can also perform a variety of MRI protocols incorporating B1-shimming into the entire sensitive area scanned during the MRI pre-scan sequence.

In accordance with an embodiment of the invention, the B1 mapping can be integrated with a B0 mapping. This has the advantage of decreasing the examination time and increasing the workflow.

In accordance with an embodiment of the invention, the B1 mapping can be used during scan preparation pulse sequences or magnetization pulse sequences during the MRI protocol outside of the FOV, but inside the volume of the B1 mapping. This has the advantage of being able to adapt the B1-shimming to a variety of volumes outside FOV. This is important, because volumes outside of the FOV can affect the image quality inside of the FOV.

In accordance with an embodiment of the invention, the B1 mapping can be used for the B1-shimming of MRI techniques selected from the group consisting of: magnetization preparation pulses, fat suppression pulses, motion sensing, Arterial Spin Labeling (ASL), Regional Saturation Technique (REST), Spectral Presaturation Inversion Recovery (SPIR), and Inversion. This is an advantage, because these techniques incorporate volumes outside of the FOV. The large B1 map allows each region which would affect image quality to have its own B1-shimming parameters optimized.

In accordance with an embodiment of the invention, the B1-shim would be able to be used for multiple MRI protocols. This means that the same B1-map could be used repeatedly to construct multiple MRI images of a variety of volumes or FOVs. This has the advantage of greatly reducing the time required to perform an MRI examination. After performing one MRI protocol, an operator could perform a different MRI protocol without having to repeat the B1 mapping.

In accordance with an embodiment of the invention, a user interface could be designed which allows the operator to apply the B1 mapping to the acquisition of one or more separate MRI images. This has the advantage of increasing the workflow and saving time during an MRI examination.

BRIEF DESCRIPTION OF THE DRAWINGS

In the following preferred embodiments of the invention are described in greater detail by way of example only making reference to the drawings in which.

DETAILED DESCRIPTION

Figure 1:
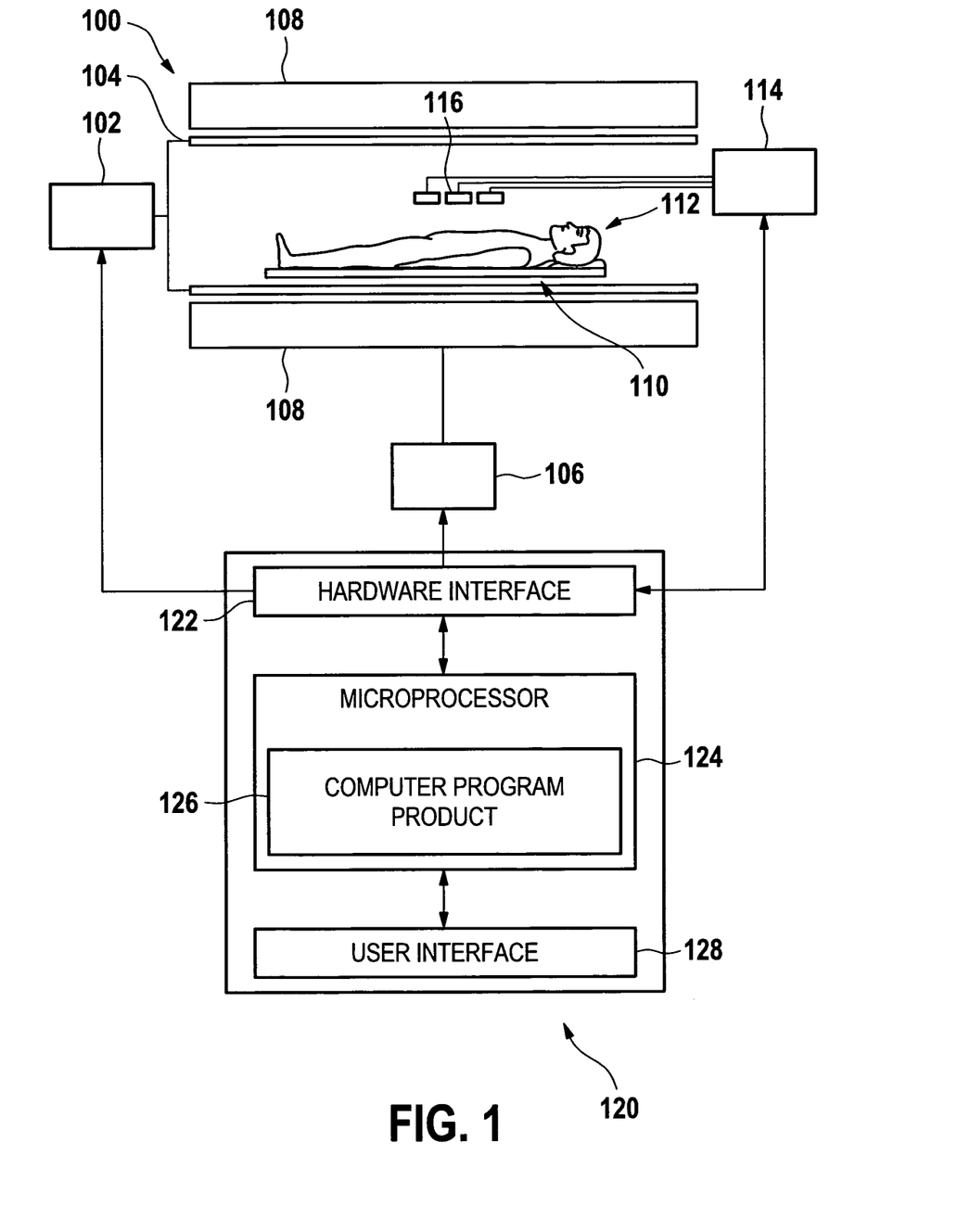
FIG. 1 is a functional schematic of an embodiment of an MRI system capable of performing an integrated B1 and MRI survey scan.

FIG. 1 shows an embodiment of an MRI scanner 100 capable of performing embodiments of the invention. There is a static magnet 108 which produces a large magnetic field, also known as B0, which is capable of causing the nuclear spins within a patient 112 or other object to align with the B0 field. The patient 112 rests within the bore of the magnet on a support 110. Gradient coils 104 are also located within the bore of the magnet and are able to adjust the magnetic field. Adjacent to the volume of the patient 112 which is to be imaged is a phased array transceiver coil 116. This coil transmits and receives RF signals. In the transmit mode, the coil generates an RF signal which produces local perturbations of the magnetic field which are used to manipulated the orientation of the nuclear spins within the patient 112. In the receive mode the phased array transceiver coil 116 receives the RF signal caused by the procession of the nuclear spins in the B0 field. The function of the transceiver coil is very commonly divided into separate transmitter and receiver coils. The term transceiver coil as used here is intended to refer to both possibilities. The exact design of the coil or coils depends upon the type of MRI examination to be performed and is well known in the art.

The gradient coils 104 are connected to a gradient coil control unit 102. The gradient coil control unit 102 incorporates a controllable current source. When the gradient coils are energized, the current through them causes a perturbation of the magnetic field within the bore of the magnet. This perturbation of the field can be used to either make the B0 field more uniform, or to purposely cause gradients in the magnetic field. An example would be using a magnetic field gradient to cause the spatial encoding of the frequency at which the nuclear spins process in the B0 field. The magnet is connected to a magnet control unit 106. The magnet control unit is for controlling and monitoring the status of the magnet.

The phased array transceiver coil 116 is connected to a RF transceiver coil control unit 114. The phased array transceiver coil 116 comprises individual coil elements. This control unit incorporates an RF generator or generators capable of independently controlling the phase and amplitude of the RF signal applied to each individual coil element of the phased array transceiver coil 116. An alternative embodiment would be to have separate transmit and receive coils.

The gradient control unit 102, the magnet control unit 106, and the transceiver coil control unit 114 are all connected to the hardware interface 122 of a control system 120. This control system controls the function of MRI scanner 100. The control system 120 comprise a hardware interface 122 and a user interface 128 connected to a microprocessor 124. The most likely embodiment of the invention would be where the microprocessor 124 is a computer system. The hardware interface 122 allows the microprocessor 124 to send commands to and receive information from the gradient control unit 102, the magnet control unit 106, and the RF transceiver control unit 114. The user interface 128 allows the operator to control the function of the MRI system, and is able to display MRI images. A computer program product 126 is used by the microprocessor to automate the control of the MRI system 100 and the analysis of the MRI data to construct MRI images.

Figure 2:
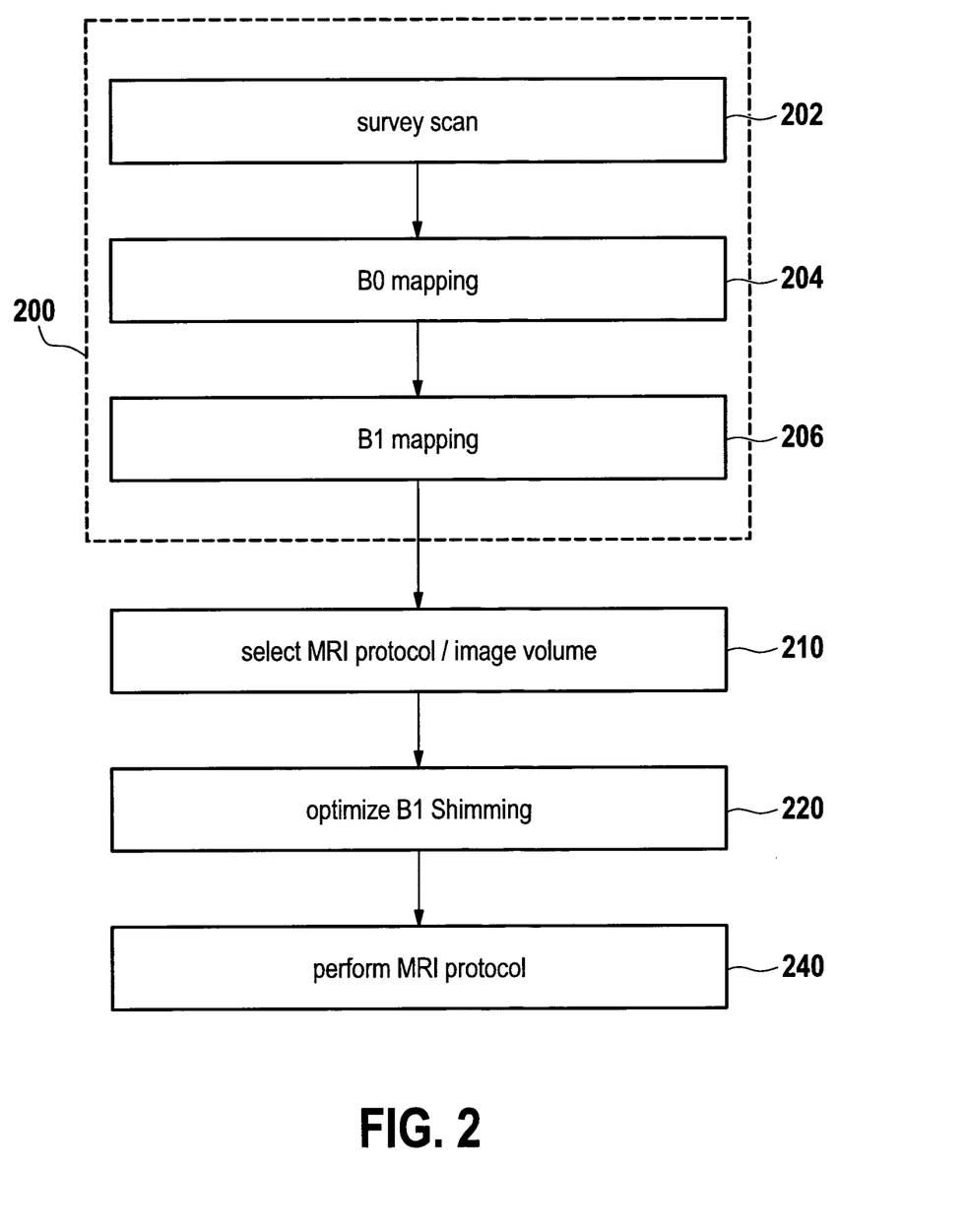
FIG. 2 is a block diagram showing an embodiment of the method of the invention.

FIG. 2 shows an embodiment of the method of performing the invention. A more detailed description is provided below in Example 1 and in Example 2. The embodiment in FIG. 2 shows an MRI pre-scan sequence 200. The MRI pre-scan sequence 200 can comprise different components that are integrated together. An example would be a survey scan 202, a B0 mapping 204, and a B1 mapping 206 that are performed sequentially or simultaneously. After the MRI pre-scan sequence 200 is complete, the operator would select an MRI imaging protocol and the image volume 210 for which an MRI image is to be constructed. The system would then use the B1 map to optimize the B1 shimming for the particular MRI protocol and image volume. After this, the MRI system 100 would perform the MRI protocol 240.

Figure 3:
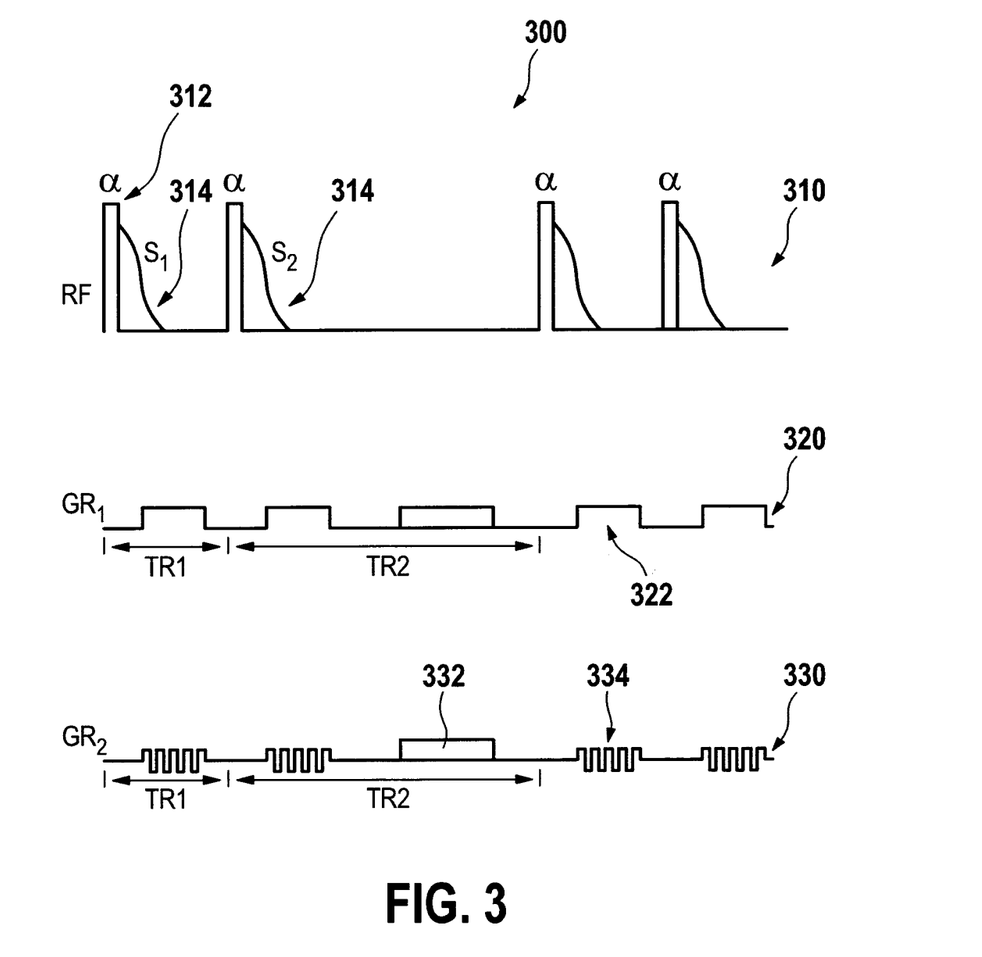
FIG. 3 is a portion of a pulse sequence timing diagram showing a standard Actual Flip-angle Imaging (AFI) pulse sequence used to measure a B1 map and an embodiment of an improvement which allows implementation of an embodiment of the invention.

FIG. 3 shows an example of a pulse sequence timing diagram 300. This figure shows a portion of an Actual Flip-angle Imaging (AFI) pulse sequence used to measure the B1-map. This pulse sequence diagram and this method of measuring the B1-map is described in detail in Yarnykh, and is not repeated here. FIG. 3 shows an RF timing sequence 310, the standard AFI gradient timing sequence 320, and an embodiment of a modified gradient timing sequence 330 which allows an implementation of an embodiment of the invention. This modified gradient timing sequence is equivalent to a combination of AFI and EPI, which allows mapping the enlarged volume without increasing the measurement time. The RF Pulse sequence diagram shows RF excitation pulses 312, which tip the nuclear spin to an angle of $\alpha$. This diagram also shows the relation of the signal intensity 314 immediately after each excitation pulse 312. The AFI gradient timing sequence 320 and the modified gradient timing sequence share several common features such as the timing delays TR1 and TR2 and the gradient crushing pulses 332. The difference between the two is that the gradient pulse 322 has been replaced with an Echo Planar Imaging (EPI) gradient pulse 334. The advantage of this change is that this has a more efficient sampling scheme. The B1-mapping can be performed more rapidly which allows its inclusion as part of the MRI pre-scan pulse sequence. In other words a B1-mapping of a larger volume can be performed more rapidly than is allowed by the current technique. FIG. 3 is discussed below in more detail below in Example 1.

Figure 4:
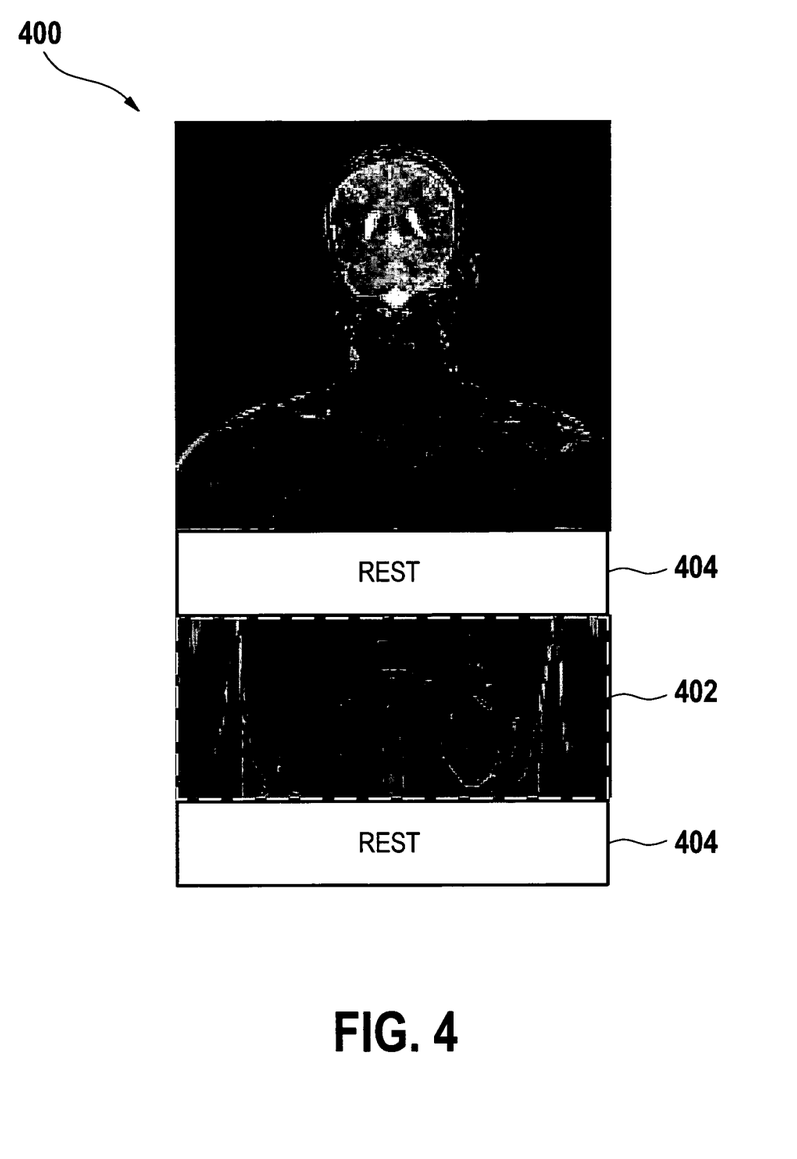
FIG. 4 is a coronal MRI image that shows a region imaged during a liver MRI protocol and regions adjacent to this volume which are subjected to a REST pulse sequence.

FIG. 4 shows a coronal MRI image of a torso 400, and shows the relationship of different RF kernels or regions that comprise an MRI liver scan. The region surrounded by a dashed box is the 3D volume sensitive to a SPIR pulse sequence 402 that comprises part of the MRI liver protocol. The white boxes show regions adjacent to the SPIR sensitive region 402 where a REgional Saturation Technique (REST) RF pulse has been applied. REST pulse sequences are applied to regions 404 that are adjacent to a FOV 402. The FOV 402 is the region being imaged. The REST pulse sequence is performed to eliminate phase effect artifacts in the FOV 402 caused by these adjacent regions 404. As was mentioned previously, the image in the FOV is constructed using Fourier integrals or transforms. Regions outside of the FOV therefore have an effect on the image. For the REST pulse sequence to have an optimal effect, B1 shimming needs to be performed in this region 404 also. If the B1-shimming is performed only in the FOV 402, the REST pulse sequence will not properly eliminate phase effect artifacts as B0 strengths are increased. This figure is discussed in more detail below in Example 1.

Depending upon the MRI protocol, the volume to which a REST pulses sequence is applied does not need to be directly adjacent to the FOV to be of a benefit. REST pulse sequences can be applied to any volume within the patient's body. This provides an additional example as to why it would be beneficial to measure a B1 map over a large volume.

Figure 5:
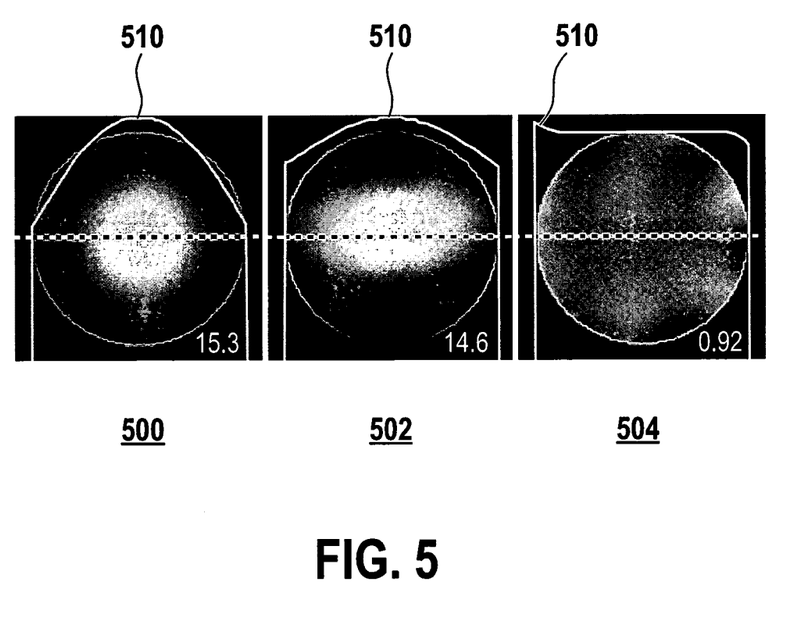
FIG. 5 is a diagram showing the effect of different types of B1 shimming on the contrast of an MRI image of water phantom.

FIG. 5 shows a demonstration of the effects of B1 shimming on a spherical water phantom (Ø=20 cm, magnitude images). The white lines (510) show the magnitude profiles taken along the dashed lines. Numbers show the normalized root-mean-square error (NRMSE) [%]. The values of the NRMSE in images 500, 502, and 504 are 15.3, 14.6, and 0.92 respectively. Image 500 shows no shim, i.e., a quadrature excitation corresponding to a circular polarization. Image 502 shows a basic RF shim based on a constant phase demand (linear optimization). Image 504 shows a basic RF shim based on an arbitrary phase demand (non-linear optimization). This figure is discussed below in Example 1.

Example 1

A liver examination is performed. As part of the preparation a low-resolution 3D volume B1 transmit mapping scan is performed to obtain the individual transmit coil sensitivities of a two-channel transmit system. For this purpose a 3D EPI accelerated scanning is performed using a modification of the approach described in Yarnykh. A portion of the modified pulse sequence diagram is shown in FIG. 3. The approach described in Yarnykh is modified by using EPI read-out pulses (334) to speed up 3D imaging. The volume of the B1 map needs to be much larger than the liver region. This is demonstrated by FIG. 4. Based on the acquired field maps, appropriate shimming coefficients for the RF objects of a specific MRI liver protocol are obtained. First the B1 homogeneity is optimized in a volume that corresponds to the FOV of a 3D gradient echo imaging scan that should be used in this example. This scan employs magnetization preparation. Thus, secondly for one of the magnetization preparation pulses, a fat suppression SPIR RF pulse, B1 is optimized. However, optimal performance for this pulse is only necessary in the actual FOV. Consequently, the same B1 shimming coefficients as before can be applied. Furthermore, two outer-volume suppression pulses should be applied at locations outside the desired 3D FOV. For these RF pulses optimal B1 homogeneity is calculated based on the acquired maps. During sequence execution the corresponding RF channel dependent phases and amplitudes are changed to maintain the proper performance of the RF objects executed.

The amplitudes and phases for each RF object can be determined, e.g., by discretizing Eq. (1) on a spatial grid of K voxels (with k being the corresponding index) and inverting the resulting vector and matrix equation, typically this is performed by a (regularized) pseudo-inversion:

$$\underline{\underline{S}}\underline{P}=\underline{C}. \quad (6)$$

Here, P is a vector containing the N complex weighting factors $P_n = A_n \exp(i\phi_n)$ for the transmit elements, and C is a vector with K constant complex components reflecting the grey values of the constant target pattern discretized on the spatial grid. The N×K matrix S contains the spatially discretized sensitivities:

$$S_{nk}=T_n(r_k). \quad (7)$$

However, in the majority of applications, only a constant amplitude |C| is required, and an arbitrary spatial phase distribution $\phi(r)$ is acceptable $C(r)=\text{const} \exp(i\phi(r))$, where const is a constant. This is the case, if only magnitude images are of interest. The resulting degree of freedom enhances the power of B1 shimming considerably. This is demonstrated in FIG. 5. However, Eq. (1) is no longer linear and corresponding nonlinear inversion techniques are required. For instance, a simulated annealing approach might be used to optimize the Eq. (1) globally in combination with a multidimensional Powell method to optimize the solution of the previous step locally. This is described in Katscher et al., Proc. ISMRM 15 (2007) 1693 (cited as Katscher).

Example 2

A pelvis examination is performed using local imaging. To image locally, a 3D RF pulse should be used to facilitate local signal excitation. This RF pulse has to be applied in an accelerated manner using an 8 element transmit system. A combined volume B1 and B0 mapping pre-scan is performed covering a larger volume than the one in that the actual scan will be performed. A parallel imaging-accelerated 3D gradient echo scan is used for mapping according to the Yarnykh approach. During the TR1 only a single echo is sampled, whereas during the long TR interval (TR2) an EPI-type readout is performed, that samples the same profile several times after excitation. This allows performing chemical shift encoding to separate water and fat and to gain a B0 field map in a post-processing step. Based on the measured volume B1 maps the relevant coil sensitivities and the B0 inhomogeneity can be extracted to perform appropriate transmit SENSE RF pulse design. This is described in Katscher U, et al. Magn. Reson. Med. 2003; 49:144-50 (cited as Katscher2). The volume thus excited will be read-out using a fast 3D EPI scan. During scanning the operator realizes that there is a second region of interest, but this one is shifted with respect to the previous region. The operator performs a new planning of the excitation volume and starts a new pulse calculation. A new B1 map does not need to be acquired, because of the volumetric information already available. The RF pulse design algorithm updates the necessary B1 and B0 information and calculates a new RF pulse, which can subsequently be applied in the imaging experiment.

Figure 6:
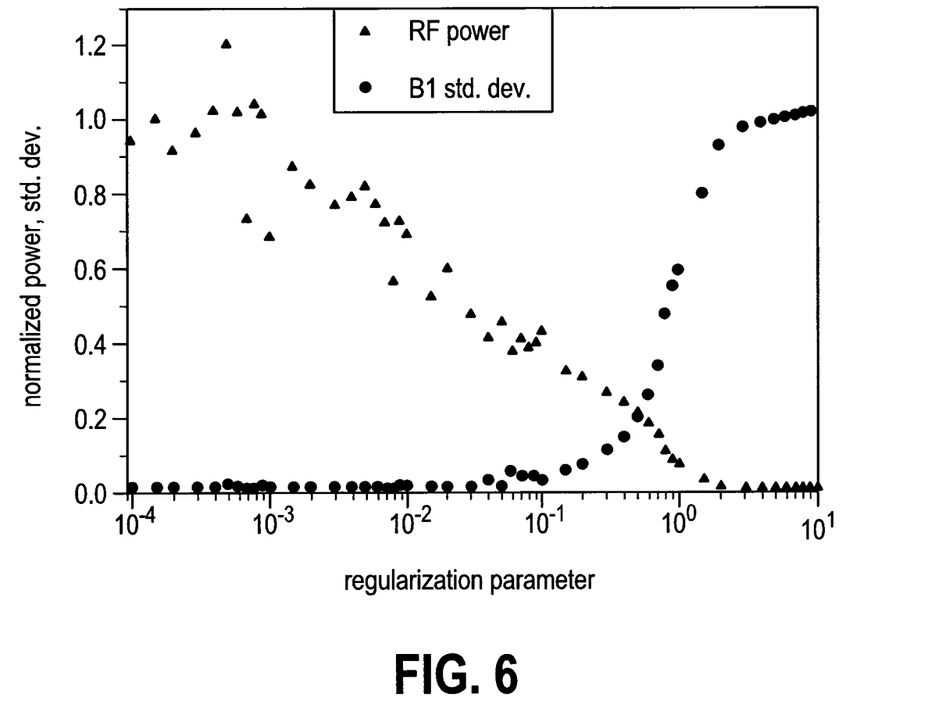
FIG. 6 is a plot that demonstrates the trade-off between B1 homogeneity and the RF power.

FIG. 6 shows a figure that demonstrates the trade-off between B1 homogeneity and the forward RF power. Values are normalized using arbitrary normalization constants. These results were obtained experimentally using a cylindrical water phantom in a whole body, 8-channel Tx/Rx MR system at 3T using the experimental apparatus described in Graesslin et al, MRI 18 (2000) 733.

For low values of the regularization parameter (the left hand side of the graph), The B1 field is very homogeneous, but the RF power used to achieve this is high. A high regularization parameter yields the converse. The RF power is low, and the inhomogeneity of the B1 field has increased. As mentioned previously, the case corresponding to a large regularization parameter is equivalent to the quadrature excitation mode. From examining this figure, it is also clear that it is possible to choose a trade-off between B1 homogeneity and the RF power.

Figure 7:
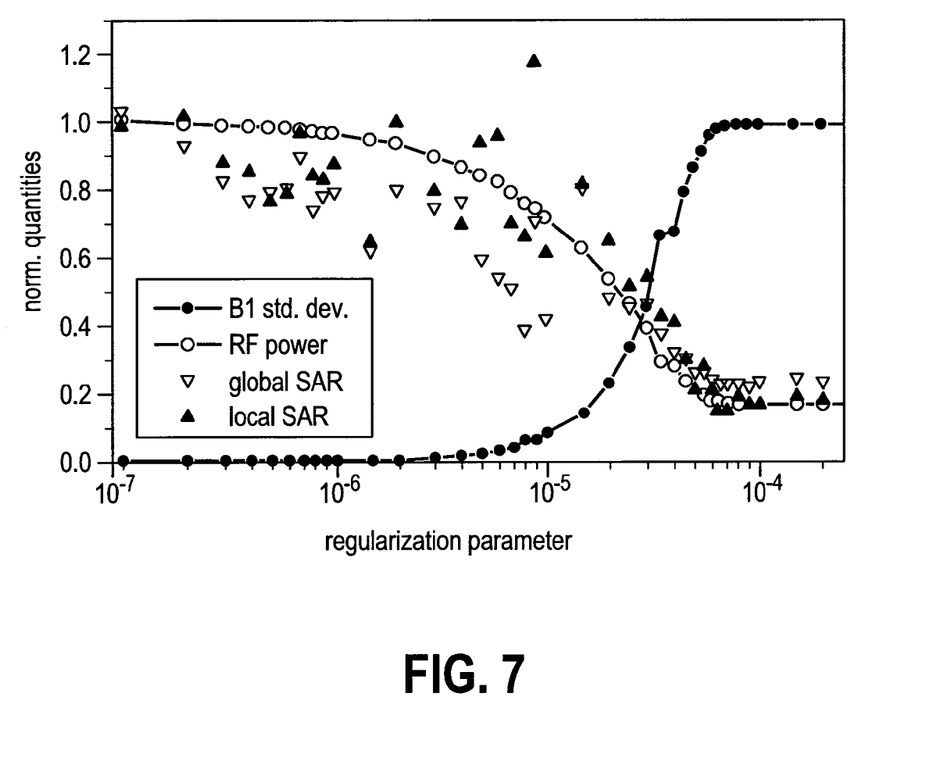
FIG. 7 is a plot that demonstrates the correlation between SAR and the forward RF power.

FIG. 7 shows a simulation that models the experimental results shown in FIG. 1. Again, arbitrary normalization constants are used. The simulation uses what is known as either the Method of Moments or the Boundary Element Method to calculate the electric fields. In addition to calculating the forward RF power and the standard deviation of the B1 field, the local SAR and the global SAR were calculated using the electric fields. This figure demonstrates the correlation between the applied, forward RF power and the clinically relevant local SAR and between the applied, forward RF power and the global SAR.

REFERENCE NUMERALS

100 MRI Scanner
102 Gradient Coil Control Unit

104 Gradient Coils
106 Magnet Control Unit
108 Magnet
110 Patient Support
112 Patient
114 RF Transceiver Coil Control Unit
116 Phased Array Transceiver Coil
120 Control System
122 Hardware Interface
124 Microprocessor or Computer
126 Computer Program Product
128 User Interface
200 MRI Pre-Scan
202 Survey Scan
204 B0 Mapping
206 B1 Mapping
210 Select MRI protocol and image volume
220 Optimize B1 shimming
240 Perform MRI protocol
300 Pulse Sequence Timing Diagram
310 RF Timing Sequence
312 RF Excitation Pulse
314 Signal Intensity
320 AFI Gradient Timing Sequence
322 Gradient Pulse
330 Modified Gradient Timing Sequence
332 Crushing Gradient Pulse
334 EPI Gradient Pulse
400 Coronal MRI Image of Torso
402 Field Of View (FOV)
404 Region subjected to REST
500 No Shim
502 Basic RF Shim (Constant Phase)
504 Basic RF Shim (Arbitrary Phase)
510 White Lines (Magnitude Profile)

The invention claimed is:

1. A method of acquiring MRI image data comprising:
performing 3-dimensional B1 mapping of a first volume using a first voxel size;
selecting an MRI protocol;
performing B1 shimming using the B1 mapping in accordance with the MRI protocol; and
performing the MRI protocol to acquire MRI imaging data of a second volume using a second voxel size,
wherein the first volume is larger than the second volume, and wherein the second volume is contained within the first volume.

2. A method of acquiring MRI image data comprising:
performing 3-dimensional B1 mapping of a first volume using a first voxel size, wherein the B1 mapping is performed with an Actual Flip-angle Imaging (AFI) pulse sequence that has a modified gradient timing sequence, gradient pulses of the modified gradient timing sequence having been replaced with Echo Pulse Imaging (EPI) gradient pulses;
selecting an MRI protocol;
performing B1 shimming in accordance with the MRI protocol; and
performing the MRI protocol to acquire MRI imaging data of a second volume using a second voxel size,
wherein the first volume is larger than the second volume, and the second volume is contained within the first volume.

3. The method of claim 1, wherein the B1 mapping is integrated with a prescan MRI sequence.

4. The method of claim 1, wherein the B1 mapping is integrated with a B0 mapping.

5. The method of claim 1, wherein the B1 mapping is used for the B1 shimming during scan preparation pulse sequences or magnetization preparation pulse sequences during the MRI protocol including regions outside the second volume, but within the first volume.

6. The method of claim 1, wherein the B1 mapping is used for the B1 shimming of a MRI technique selected from the group consisting of: magnetization preparation pulses, fat suppression pulses, motion sensing, Arterial Spin Labeling (ASL), Regional Saturation Technique (REST), Spectral Presaturation Inversion Recovery (SPIR), and Inversion.

7. A non-transitory computer readable medium storing a set of computer executable instructions for causing a computer processor to perform the method of claim 1.

8. An apparatus for acquiring MRI images data comprising:
means for performing 3-dimensional B1 mapping of a first volume using a first voxel size,
means for selecting an MRI protocol,
means for performing B1 shimming using the B1 mapping in accordance with said MRI protocol,
means for performing the MRI protocol to acquire MRI imaging data of a second volume using a second voxel size,
wherein the first voxel size is larger than the second voxel size, and wherein the second volume is contained within the first volume.

9. The apparatus of claim 8, further comprising:
one or more transmit channels; and
means for minimizing a first cost function providing a set of complex amplitudes, wherein there is an element of the set of complex amplitudes for each transmit channel, wherein the element specifies the amplitude and phase to be used by its corresponding transmit channel, wherein the first cost function comprises a specific absorption rate (SAR) term and a second cost function, wherein the second cost function is calculated using spatial transmit sensitivity distributions for the transmit channels and the set of complex amplitudes, wherein the SAR term is calculated using the set of complex amplitudes, the spatial transmit sensitivity distributions, and a regularization parameter operable for adjusting a trade-off between SAR and B1 field homogeneity, wherein the SAR term is weighted with the regularization parameter, and wherein the SAR term is inversely proportional to the spatial transmit sensitivity distributions.

10. The apparatus of claim 9, further comprising:
a user interface allowing an operator to enter a parameter, wherein the parameter adjusts the trade-off between the B1 homogeneity and total forward power used during examination.

11. The apparatus of claim 8, wherein the means for performing the B1 mapping is operable to integrate the B1 mapping with a prescan MRI sequence.

12. The apparatus of claim 8, wherein the means for performing the B1 mapping is operable to integrate the B1 mapping with B0 mapping.

13. The apparatus of claim 8, wherein the means for performing the B1 shimming is operable for the purpose of B1 shimming during scan preparation pulse sequences or magnetization pulses during the MRI protocol including regions outside the second volume, but within the first volume.

14. The apparatus of claim 8, wherein the means for performing the B1 shimming is operable for the purpose of B1-shimming during an MRI technique selected from the group consisting of: magnetization preparation pulses, fat suppression pulses, motion sensing, arterial spin labeling (ASL), Regional Saturation Technique (REST), Spectral Presaturation Inversion Recovery (SPIR), and Inversion.

15. The apparatus of claim 8, wherein the means for performing the B1 shimming is operable to allow one or more additional B1-shims of one or more additional MRI protocols,
  wherein the one or more additional MRI protocols acquire images of one or more additional volumes using one or more additional voxel sizes, wherein the one or more additional voxel sizes are smaller than the first voxel size, and wherein the one or more additional volumes are contained within the first volume.

16. The method of claim 1, wherein the first voxel size is larger than the second voxel size.

17. The method of claim 2, wherein the first voxel size is larger than the second voxel size.

* * * * *